United States Patent
Hoya et al.

(10) Patent No.: US 6,822,891 B1
(45) Date of Patent: Nov. 23, 2004

(54) FERROELECTRIC MEMORY DEVICE

(75) Inventors: Katsuhiko Hoya, Yokohama (JP); Daisaburo Takashima, Yokohama (JP); Nobert Rehm, Yokohama (JP)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 0 days.

(21) Appl. No.: 10/461,367

(22) Filed: Jun. 16, 2003

(51) Int. Cl.[7] ................................................ G11C 7/00
(52) U.S. Cl. ........................ 365/145; 365/63; 365/206; 365/207; 365/210; 365/202
(58) Field of Search ........................ 365/145, 63, 206, 365/207, 210, 202

(56) References Cited

U.S. PATENT DOCUMENTS

| | | | | |
|---|---|---|---|---|
| 5,373,463 A | * | 12/1994 | Jones Jr. ................ | 365/145 |
| 5,943,256 A | * | 8/1999 | Shimizu et al. ........ | 365/145 |
| 6,297,986 B1 | * | 10/2001 | Jae Kap ................. | 365/145 |
| 2003/0206430 A1 | * | 11/2003 | Ho ......................... | 365/145 |

FOREIGN PATENT DOCUMENTS

| | | | |
|---|---|---|---|
| JP | 10-200061 | 7/1998 | |
| JP | 410200061 A | * 7/1998 | ........... H01L/27/10 |
| JP | 02001351373 A | * 12/2001 | |

OTHER PUBLICATIONS

D. Takashima, et al., Symposium on VLSI Circuits Digest of Technical Papers, pp. 83–84, "High–Density Chain Ferro-electric Random–Access Memory (CFRAM)", Jun. 1997.

* cited by examiner

*Primary Examiner*—Viet Q. Nguyen
(74) *Attorney, Agent, or Firm*—Oblon, Spivak, McClelland, Maier & Neustadt, P.C.

(57) ABSTRACT

A ferroelectric memory device includes a memory cell array having memory cells arranged in a matrix form. Each of the memory cells includes a cell transistor and a ferroelectric capacitor. It further includes a first dummy bit line arranged outside a bit line arranged on an end portion of the memory cell array and separated from the bit line arranged on the end portion of the memory cell array with an interval which is the same as a pitch between the bit lines in the memory cell array and having the same width as the bit line, and a first dummy memory cell connected to the first dummy bit line and having the same structure as the memory cell.

18 Claims, 9 Drawing Sheets

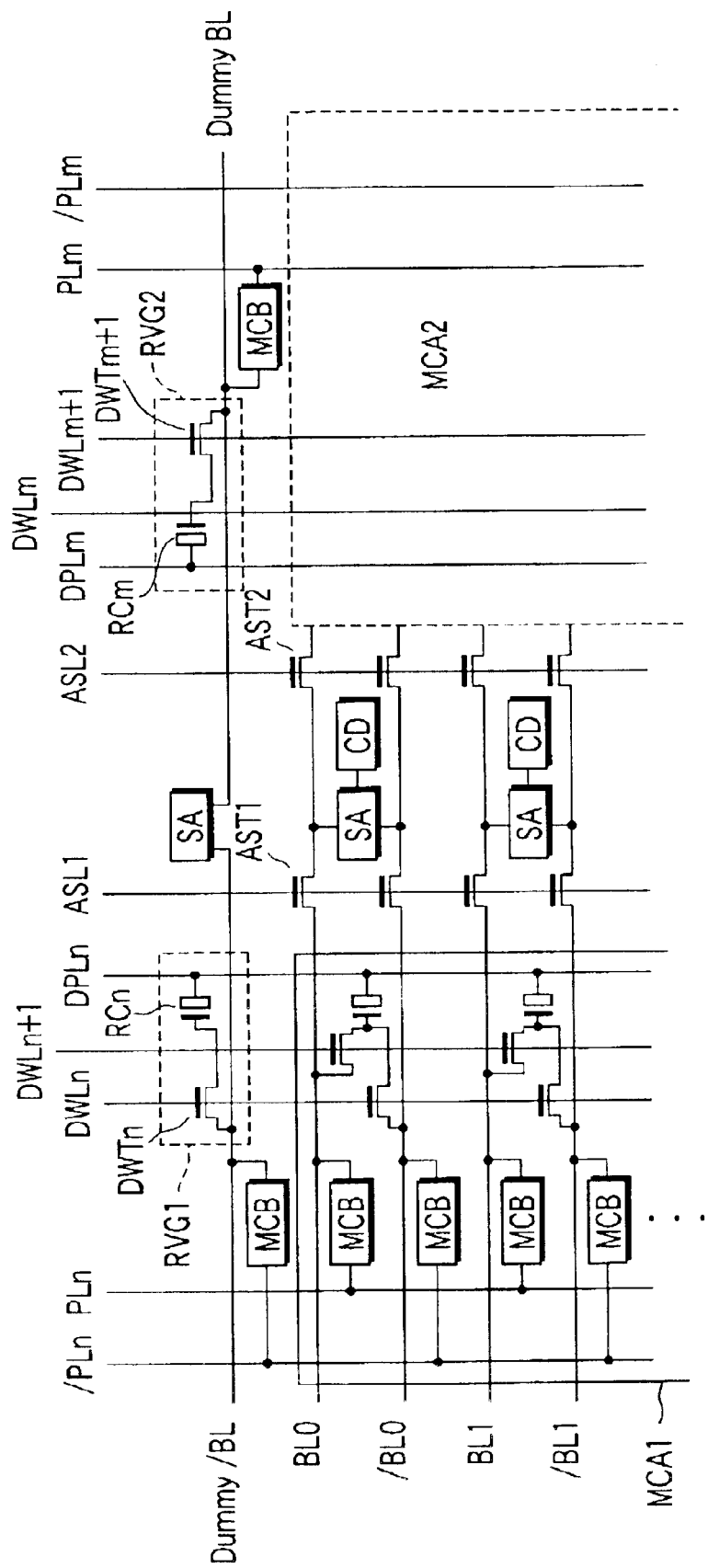
F I G. 9

FERROELECTRIC MEMORY DEVICE

BACKGROUND OF THE INVENTION

1. Field of the Invention

This invention relates to a ferroelectric memory device which stores data in a nonvolatile fashion by use of a ferroelectric capacitor.

2. Description of the Related Art

A ferroelectric memory device stores binary data in a nonvolatile fashion according to the intensity of residual dielectric polarization of a ferroelectric capacitor. A memory cell of a conventional ferroelectric memory device is configured by connecting the ferroelectric capacitor and a transistor in series as in the case of a DRAM, for example. However, unlike the DRAM, since data is held depending on the intensity of residual dielectric polarization in the ferroelectric memory device, it is necessary to drive a plate line in order to read out signal charges onto a bit line. Therefore, in the conventional ferroelectric memory device, a plate line driving circuit is required to have a large area.

In order to cope with the above problem, a cell array system of the ferroelectric memory device which can reduce the area of the plate line driving circuit has been proposed by Takashima et al. (D. Takashima et al., "High-density chain ferroelectric random memory (CFRAM)" in Proc. VSLI Symp., June 1997, pp. 83–84). In the above cell array system, a memory cell is configured by respectively connecting two ends of the ferroelectric capacitor to the source and drain of a cell transistor, and a plurality of memory cells with the same configuration as described above are serially connected to configure a memory cell block. In the series connected TC unit type ferroelectric RAM, since the plate line driving circuit can be commonly used by eight memory cells, for example, the memory cell array can be integrated with a high integration density.

In the series connected TC unit type ferroelectric RAM with the above configuration, it is a common practice to arrange a dummy bit line outside the memory cell array and use the dummy bit line as a shield line by fixing the dummy bit line at ground potential, for example, so as to prevent occurrence of noise from the exterior of the memory cell array.

Further, a ferroelectric memory device in which a dummy bit line is arranged on the exterior of the memory cell array to compensate for capacitive coupling of the bit line on the end portion of the memory cell array has been proposed (Jpn. Pat. Appln. KOKAI Publication 10-200061).

It is known that the influence of noise (hereinafter referred to as coupling noise) caused by parasitic capacitance between wirings occurs when data which is read out onto the bit line arranged in the memory cell array is sensed. When two bit lines are arranged on both sides of a bit line with the same pitch and if the amount of coupling noise given to the bit line from one of the two bit lines is $\delta$, the amount of coupling noise $2\delta$ occurs by taking the coupling noise $\delta$ given from the other bit line into consideration.

However, in the case of the bit line arranged on the end portion of the memory cell array, no coupling noise is given to the bit line from the dummy bit line fixed at the ground potential. Therefore, only the coupling noise $\delta$ from one bit line is given to the bit line arranged on the end portion of the memory cell array. For example, when data is sensed in a two transistor-two capacitor (2T2C) system and it "1" is read out onto the bit line arranged on the end portion of the memory cell array and "0" is read out onto the adjacent bit line, the difference between the readout potentials is reduced by $\delta$ and, as a result, the sense margin is reduced by $\delta$.

Thus, there occurs a problem that the sense margin is reduced due to an imbalance of coupling noise between the bit lines arranged on the end portion of the memory cell array, the retention characteristic is degraded and the yield rate is lowered.

BRIEF SUMMARY OF THE INVENTION

A ferroelectric memory device according to an aspect of the present invention includes a memory cell array having memory cells arranged in a matrix form. Each of the memory cells includes a cell transistor and a ferroelectric capacitor, one of source and drain regions of the cell transistor being electrically connected to a corresponding one of bit lines, a gate of the cell transistor being electrically connected to a corresponding one of word lines, the other one of the source and drain regions of the cell transistor being electrically connected to one electrode of the ferroelectric capacitor, the other electrode of the ferroelectric capacitor being electrically connected to a corresponding one of plate lines. It further includes a first dummy bit line arranged outside a bit line arranged on an end portion of the memory cell array and separated from the bit line arranged on the end portion of the memory cell array with an interval which is the same as a pitch between the bit lines in the memory cell array and having the same width as the bit line, and a first dummy memory cell electrically connected to the first dummy bit line and having the same structure as the memory cell.

A ferroelectric memory device according to another aspect of the present invention includes a first memory cell array having memory cells arranged in a matrix form. Each of memory cells includes a cell transistor and a ferroelectric capacitor, one of source and drain regions of the cell transistor being electrically connected to a corresponding one of bit lines, a gate of the cell transistor being electrically connected to a corresponding one of word lines, the other one of the source and drain regions of the cell transistor being electrically connected to one electrode of the ferroelectric capacitor, the other electrode of the ferroelectric capacitor being electrically connected to a corresponding one of plate lines. It includes a second memory cell array arranged adjacent to the first memory cell array to commonly use the bit lines electrically connected to the first memory cell array and having the same structure as the first memory cell array. Further, it includes a first dummy bit line arranged outside a bit line arranged on an end portion of the first memory cell array and separated from the bit line arranged on the end portion of the first memory cell array with an interval which is the same as the pitch between the bit lines in the first memory cell array and having the same width as the bit line, a first dummy memory cell electrically connected to the first dummy bit line and having the same structure as the memory cell. It includes a second dummy bit line arranged outside a bit line arranged on an end portion of the second memory cell array and separated from the bit line arranged on the end portion of the second memory cell array with an interval which is the same as the pitch between the bit lines in the second memory cell array and having the same width as the bit line, and a second dummy memory cell electrically connected to the second dummy bit line and having the same structure as the memory cell.

A ferroelectric memory device according to still another aspect of the present invention includes a memory cell array having memory cells arranged in a matrix form. Each of the memory cells includes a cell transistor and a ferroelectric capacitor, one of source and drain regions of the cell transistor being electrically connected to a corresponding one of bit lines, a gate of the cell transistor being electrically connected to a corresponding one of word lines, the other one of the source and drain regions of the cell transistor being electrically connected to one electrode of the ferroelectric capacitor, the other electrode of the ferroelectric capacitor being electrically connected to a corresponding one of plate lines. Further, it includes a dummy bit line arranged outside a bit line arranged on an end portion of the memory cell array, a capacitor having one electrode electrically connected to the dummy bit line, and a dummy bit line driving circuit having an output terminal electrically connected to the other electrode of the capacitor and input terminals electrically connected to the plate lines, respectively, and detecting drive of the plate lines.

BRIEF DESCRIPTION OF THE SEVERAL VIEWS OF THE DRAWING

FIG. 9 is a schematic circuit diagram showing the configuration of the main portion of a series connected TC unit type ferroelectric RAM according to a third embodiment of this invention;

DETAILED DESCRIPTION OF THE INVENTION

There will now be described embodiments of this invention with reference to the accompanying drawings. In the following explanation, constituents having the same function and configuration are denoted by the same reference symbols and the repetitive explanation is made only when necessary.

(First Embodiment)

Figure 1:
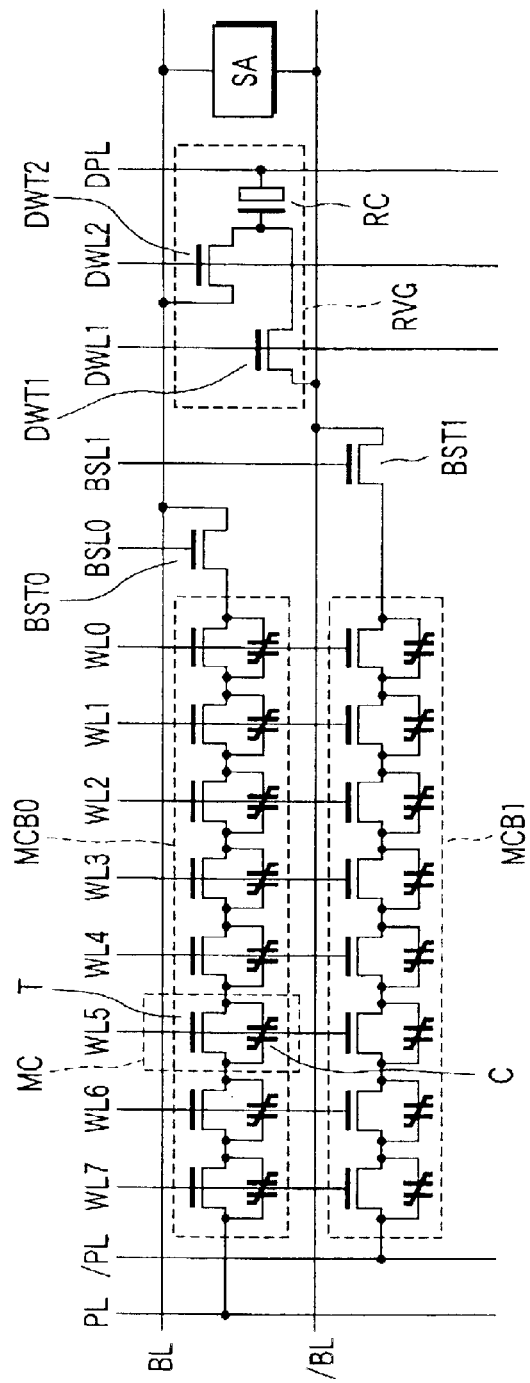
FIG. 1 is a circuit diagram showing a memory cell block MCB which configure a series connected TC unit type ferroelectric RAM according to a first embodiment of this invention.

FIG. 1 is a circuit diagram showing memory cell blocks MCB which configure a series connected TC unit type ferroelectric RAM according to a first embodiment of this invention.

A memory cell MC is configured by connecting a ferroelectric capacitor C and a cell transistor T in parallel. The memory cell block MCB is configured by electrically connecting, for example, eight memory cells with the same structure as the memory cell MC in series. In FIG. 1, two memory blocks MCB0, MCB1 which are electrically connected to a pair of bit lines BL, /BL, respectively, are shown. The phrase "electrically connected to" is replaced hereinafter by "connected to".

One-side ends of the memory blocks MCB0, MCB1 are respectively connected to the bit lines BL, /BL via block selection transistors BST0, BST1. The other ends of the memory blocks MCB0, MCB1 are respectively connected to plate lines PL, /PL. The gate of the cell transistor T of each memory cell block MCB is connected to a corresponding one of word lines WL0 to WL7. The gates of the block selection transistors BST0, BST1 are respectively connected to block selection signal lines BLS0, BSL1.

Two systems, that is, a 2T2C system of holding one-bit data by use of two cell transistors and two ferroelectric capacitors and a 1T1C system of holding one-bit data by use of one cell transistor and one ferroelectric capacitor are provided as a data holding system of the ferroelectric memory device. The series connected TC unit type ferroelectric RAM shown in FIG. 1 has a configuration to which both of the 2T2C system and 1T1C system can be commonly applied.

In the 1T1C system, a reference voltage generating circuit RVG which generates reference voltage includes dummy word transistors DWT1, DWT2 and a reference capacitor RC. One of the electrodes of the reference capacitor RC is connected to a dummy plate line DPL. The other electrode of the reference capacitor RC is connected to sources/drains of the dummy word transistors DWT1, DWT2. The drain/source of the dummy word transistor DWT1 is connected to the bit line /BL. The drain/source of the dummy word transistor DWT2 is connected to the bit line BL. The gate of the dummy word transistor DWT1 is connected to a dummy word line DWL1. The gate of the dummy word transistor DWT2 is connected to a dummy word line DWL2.

The bit lines BL, /BL are connected to a sense amplifier circuit SA which senses and amplifies readout data.

Figure 2:
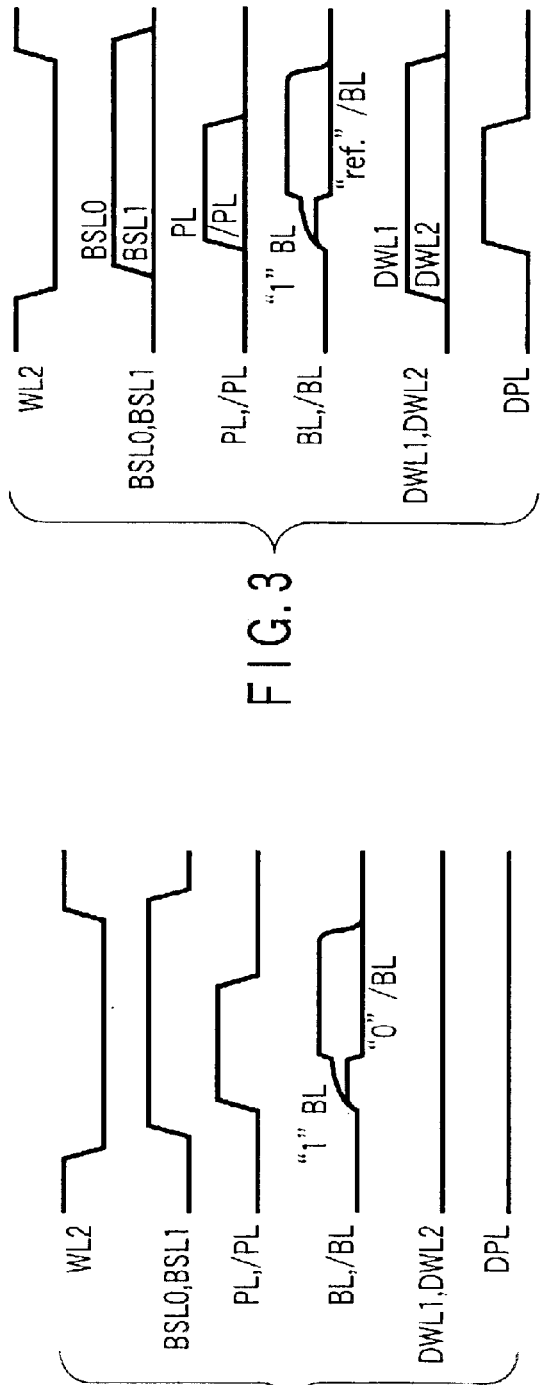
FIG. 2 is an operation timing diagram in the 2T2C system of the memory cell block MCB shown in FIG. 1.

FIG. 2 is an operation timing diagram in the 2T2C system of the memory cell block MCB with the above configuration. It is assumed that the memory cell MC stores a state in which the residual dielectric polarization of the ferroelectric capacitor C is positive as data "1" and stores a state in which the residual dielectric polarization thereof is negative as data "0". At the standby time, all of the word lines WL are kept at "H", the block selection signal lines BSL0, BSL1 are kept at "L" and the bit lines BL, /BL and plate lines PL, /PL are kept at VSS (ground potential). At this time, two terminals of the ferroelectric capacitor C are short-circuited by the cell transistor which is set in the ON state so as to stably hold data.

At the active time, for example, when the memory cell MC on the bit line BL side is selected by use of the word line WL2, the bit line BL is set into an electrically floating state, the word line WL2 is set to "L", then the block selection signal line BLS0 is set to "H" and the plate line PL is raised from VSS (ground potential) to VAA (positive potential). As a result, voltage is applied to the ferroelectric capacitor C of the selected memory cell MC and signal voltage is read out onto the bit line BL according to the data "0", "1". In this case, data which is complementary to data stored in the memory cell MC on the bit line BL side is stored in the memory cell MC on the bit line /BL side selected by the word line WL2. Therefore, signal voltage is read out onto the bit line /BL according to the data "0", "1" in the same manner as described above by setting the block selection signal line BSL1 to "H".

The signal voltages read out onto the bit lines BL, /BL are compared with each other and the compared data is amplified by the sense amplifier circuit SA which is activated and the data "0", "1" is sensed. After this, the sense amplifier circuit SA is deactivated and the readout data is rewritten.

In the readout and rewriting operations, the destructive readout operation is performed in the case of "1" data and the nondestructive readout operation is performed in the case of "0" data. That is, in the case of "1" data, the amount of residual dielectric polarization of the ferroelectric capacitor is greatly reduced by application of positive voltage from the plate line and inversion of polarization occurs. Then, if the plate line voltage is lowered after the readout operation, a voltage opposite to that at the readout time is applied to the ferroelectric capacitor to rewrite the data since the bit line is set at high potential by the readout data. In the case of "0" data, inversion of polarization due to the plate line voltage does not occur, the opposite voltage is not applied after the readout operation and data of the original negative residual dielectric polarization state is rewritten.

Figure 3:
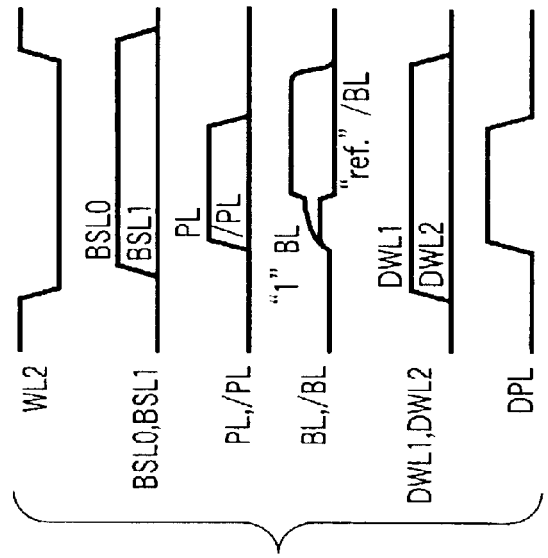
FIG. 3 is an operation timing diagram in the 1T1C system of the memory cell block MCB shown in FIG. 1.

FIG. 3 is an operation timing diagram in the 1T1C system of the memory cell block MCB shown in FIG. 1.

At the active time, for example, when the memory cell MC on the bit line BL side is selected by use of the word line WL2, the bit line BL is set into an electrically floating state, the word line WL2 is set to "L", then the block selection signal line BLS0 is set to "H" and the plate line PL is raised from VSS (ground potential) to VAA (positive potential). Further, the dummy word line DWL1 is set to "H" and reference voltage is applied to the bit line /BL.

The signal voltage read out onto the bit line BL is compared with the reference voltage and the compared data is amplified by the sense amplifier circuit SA which is activated and data "0", "1" is sensed.

Figure 4:
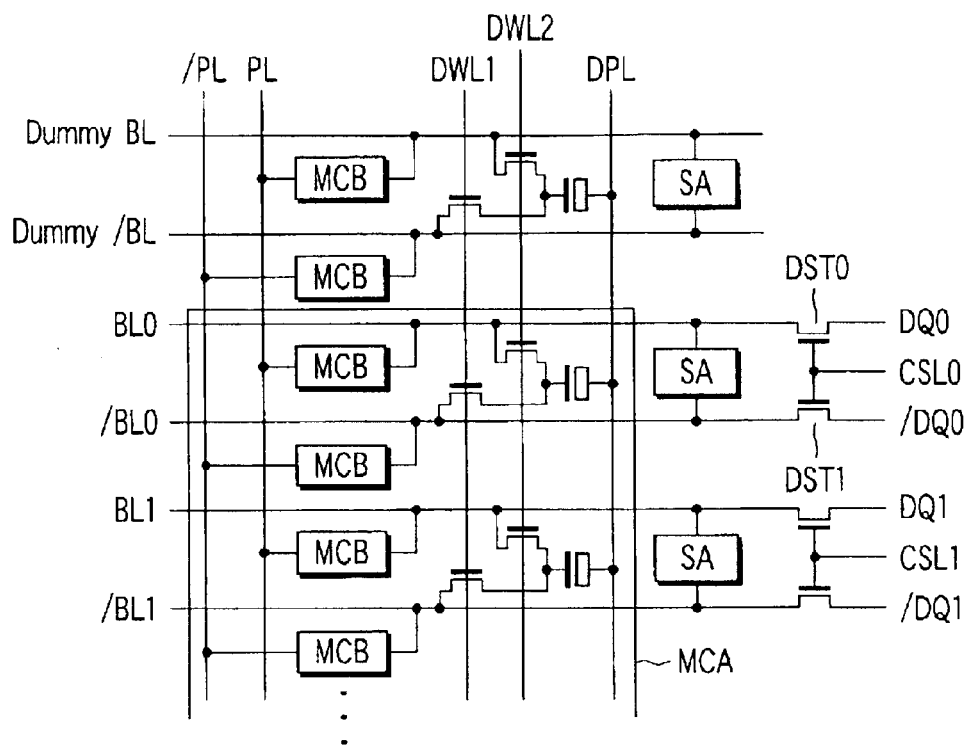
FIG. 4 is a schematic circuit diagram showing the configuration of the main portion of the series connected TC unit type ferroelectric RAM according to the first embodiment of this invention.

FIG. 4 is a schematic circuit diagram showing the configuration of the main portion of the series connected TC unit type ferroelectric RAM according to the first embodiment of this invention.

A plurality of memory cell blocks which have the same configuration as the memory cell blocks MCB0, MCB1 shown in FIG. 1 are arranged to configure a memory cell array MCA.

Bit lines BL0, /BL0 are connected to data lines DQ0, /DQ0 via data selection transistors DST0, DST1. The gates of the data selection transistors DST0, DST1 are connected to a column decoder CD (not shown) and a column selection signal is applied thereto via a column selection signal line CSL0 to output data via the data lines DQ0, /DQ0.

Dummy bit lines DummyBL and Dummy/BL are respectively arranged outside the memory cell array MCA and separated from the bit line BL0 which is arranged on the end portion of the memory cell array MCA with an interval which is the same as the pitch between the paired bit lines in the memory cell array MCA. The Dummy bit lines DummyBL and Dummy/BL respectively have the same width as the bit line in the memory cell array MCA. Memory cell blocks MCB are connected to the respective dummy bit lines DummyBL, Dummy/BL and a reference voltage generating circuit RVG and sense amplifier circuit SA are connected. Further, data lines and a column gate are not connected to the dummy bit lines DummyBL, Dummy/BL.

Figure 5:
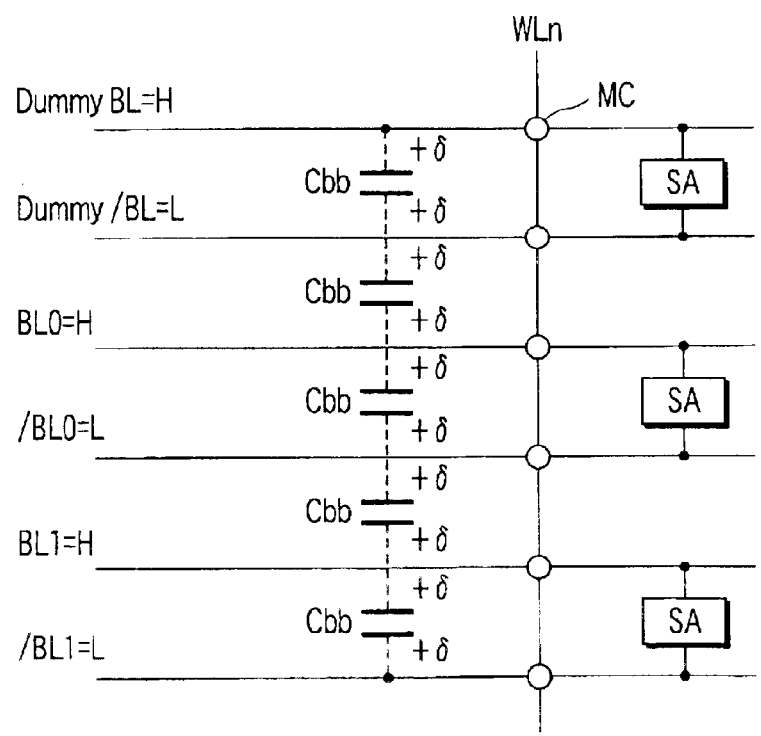
FIG. 5 is a diagram showing one example of parasitic capacitances Cbb between the respective bit lines in the 2T2C system of the series connected TC unit type ferroelectric RAM shown in FIG. 4 and coupling noise δ caused by the parasitic capacitance Cbb.

The operation of the 2T2C system of the series connected TC unit type ferroelectric RAM with the above configuration is explained below. FIG. 5 is a diagram showing parasitic capacitances Cbb between the respective bit lines and coupling noise δ caused by the parasitic capacitance Cbb.

In order to read out data stored in the memory cell MC connected to the word line WLn, potential VAA (positive potential) is applied to the plate lines PL, /PL. For example, it is assumed that data "1" is read out onto the dummy bit line DummyBL and bit lines BL0, BL1. In the case of the 2T2C system, data "0" is read out onto the dummy bit line Dummy/BL and bit lines /BL0, /BL1.

If VAA (positive potential) is applied to the plate lines PL, /PL and data is read out onto the respective bit lines, coupling noises δ are instantaneously caused on the respective bit lines by the presence of the parasitic capacitances Cbb between the respective bit lines. The bit line /BL0 receives the coupling noise of 2δ from the adjacent bit lines BL0 and BL1. Further, since the dummy bit lines DummyBL, Dummy/BL are provided, the bit line BL0 disposed on the end portion of the memory cell array MCA also receives the coupling noise of 2δ from the adjacent dummy bit line Dummy/BL and bit line /BL0.

As a result, when data read out from the paired bit lines BL0, /BL0 is sensed by the sense amplifier circuit SA, readout potentials of "1" data of the bit line BL0 and "0" data of the bit line /BL0 are both increased by 2δ. Therefore, as in the case of the bit lines in the memory cell array MCA, an imbalance in the coupling noise will not occur on the bit line BL0.

Figure 6:
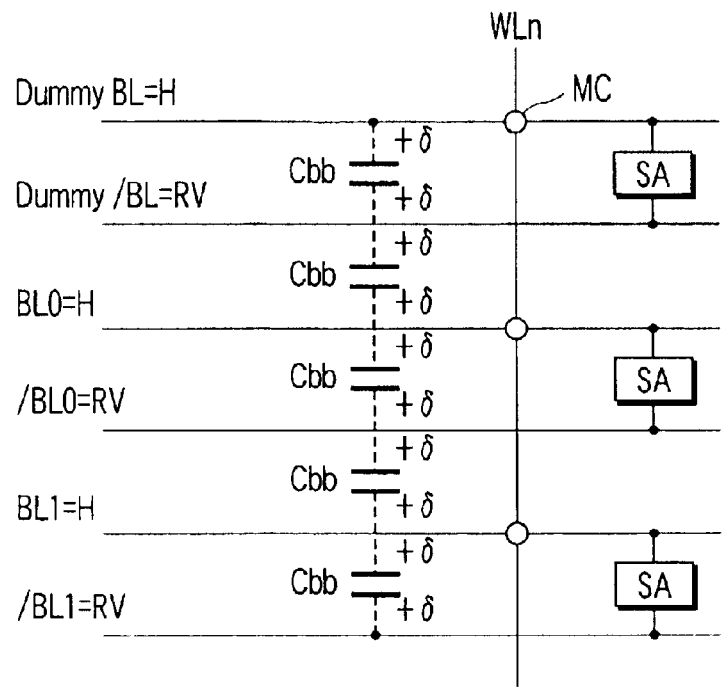
FIG. 6 is a diagram showing one example of parasitic capacitances Cbb between the respective bit lines in the 1T1C system of the series connected TC unit type ferroelectric RAM shown in FIG. 4 and coupling noise δ caused by the parasitic capacitance Cbb.

FIG. 6 is a diagram showing one example of parasitic capacitances Cbb between the respective bit lines in the 1T1C system and coupling noise δ caused by the parasitic capacitance Cbb.

For example, assume that data "1" is read out onto the dummy bit line DummyBL and bit lines BL0, BL1. In the case of the 1T1C system, the reference voltage RV is applied to the dummy bit line Dummy/BL and bit lines /BL0, /BL1. If VAA (positive potential) is applied to the plate lines PL, /PL, coupling noises δ are instantaneously caused on the respective bit lines by the presence of the parasitic capacitances Cbb between the respective bit lines. Therefore, as in the case of the 2T2C system, the bit line BL0 disposed on the end portion of the memory cell array MCA receives the coupling noise of 2δ from the adjacent dummy bit line Dummy/BL and bit line /BL0.

Figure 7:
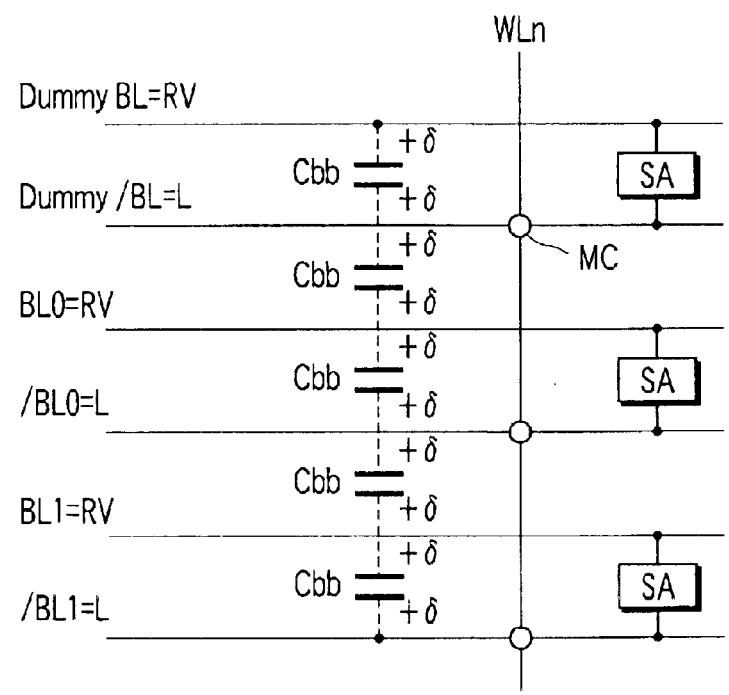
FIG. 7 is a diagram showing the other example of parasitic capacitances Cbb between the respective bit lines in the 1T1C system of the series connected TC unit type ferroelectric RAM shown in FIG. 4 and coupling noise δ caused by the parasitic capacitance Cbb.

Next, in the 1T1C system, for example, assume that data "0" is read out onto the dummy bit line Dummy/BL and bit lines /BL0, /BL1. FIG. 7 is a diagram showing parasitic capacitances Cbb between the respective bit lines in the above case and coupling noise δ caused by the parasitic capacitance Cbb.

In the case of the 1T1C system, if "0" data is read out onto the dummy bit line Dummy/BL and bit lines /BL0, /BL1, the reference voltage RV is applied to the dummy bit line DummyBL and bit lines BL0, BL1. If VAA (positive potential) is applied to the plate lines PL, /PL, coupling noises δ are instantaneously caused on the respective bit lines by the presence of the parasitic capacitances Cbb between the respective bit lines. Therefore, as in the case of the 2T2C system, the bit line BL0 disposed on the end portion of the memory cell array MCA receives the coupling noise of 2δ from the adjacent dummy bit line Dummy/BL and bit line /BL0.

As described above, in the present embodiment, the dummy bit lines DummyBL and Dummy/BL are arranged outside and apart from the bit line BL0 disposed on the end portion of the memory cell array MCA with an interval which is the same as the pitch between the paired bit lines in the memory cell array MCA. The Dummy bit lines DummyBL and Dummy/BL respectively have the same width as the bit line in the memory cell array MCA. Further, the sense amplifier circuit SA is connected to the dummy bit lines DummyBL, Dummy/BL and data lines are not connected to the dummy bit lines.

Therefore, according to the present embodiment, an imbalance in the coupling noise occurring on the bit line disposed on the end portion of the memory cell array MCA can be suppressed. As a result, a reduction in the sense margin of the sense amplifier circuit SA can be prevented and data can be correctly sensed.

Further, since the sense amplifier circuit SA is connected to the dummy bit lines DummyBL, Dummy/BL, the same operation as that of the bit lines in the memory cell array MCA can be attained. Therefore, the same coupling noise as that occurring on the other bit line in the memory cell array MCA can be caused on the bit line BL0.

Further, since the data lines DQ are not connected to the dummy bit lines DummyBL, Dummy/BL, an extra circuit can be omitted and the circuit space can be reduced.

(Second Embodiment)

In a second embodiment of this invention, paired dummy bit lines are arranged outside the memory cell array MCA and a dummy bit line connected to VSS (ground potential) is further arranged outside the paired dummy bit lines.

Figure 8:
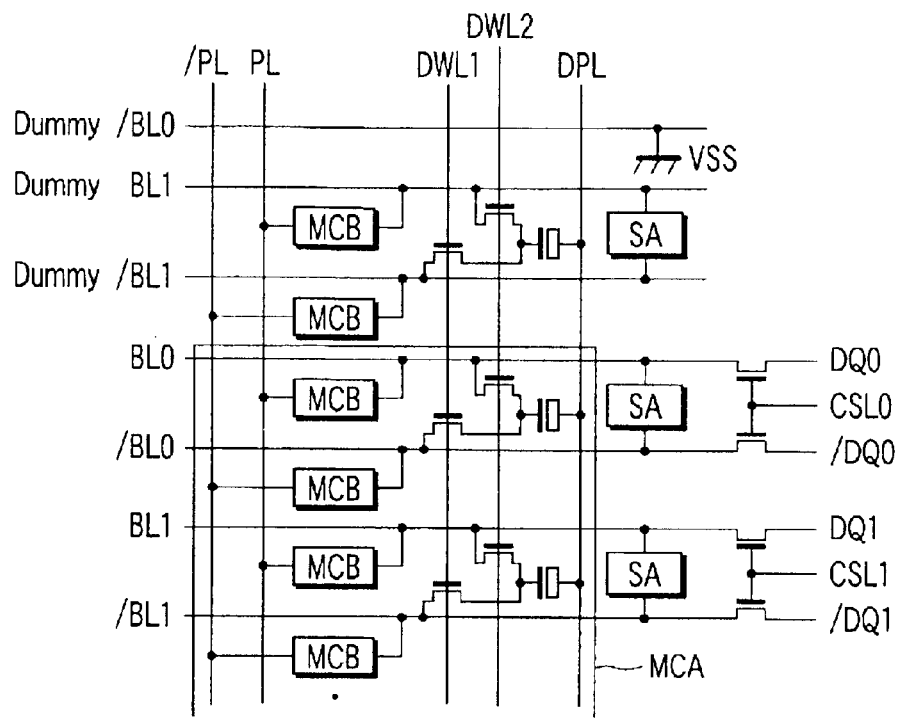
FIG. 8 is a schematic circuit diagram showing the configuration of the main portion of a series connected TC unit type ferroelectric RAM according to a second embodiment of this invention.

FIG. 8 is a schematic circuit diagram showing the configuration of the main portion of a series connected TC unit type ferroelectric RAM according to the second embodiment of this invention. The configuration of the memory cell array MCA and paired dummy bit lines DummyBL1, Dummy/BL1 is the same as that in the first embodiment.

A dummy bit line Dummy/BL0 is disposed outside the dummy bit line DummyBL1 and separated from the dummy bit line DummyBL1 with an interval which is the same as the pitch between the paired bit lines in the memory cell array MCA. The potential of the dummy bit line Dummy/BL0 is fixed at VSS (ground potential).

As in the first embodiment, in the series connected TC unit type ferroelectric RAM with the above configuration, an imbalance in the coupling noise occurring on the bit line BL0 can be eliminated. Further, in order to prevent noise from the exterior from being applied to the memory cell array MCA and paired dummy bit lines DummyBL1, Dummy/BL1, the dummy bit line Dummy/BL0 fixed at VSS (ground potential) is provided.

Therefore, according to the present embodiment, an imbalance in the coupling noise occurring on the bit line disposed on the end portion of the memory cell array MCA can be eliminated. As a result, a reduction in the sense margin of the sense amplifier circuit SA can be prevented and data can be correctly sensed.

Further, the dummy bit line Dummy/BL0 functions as a shield line and can prevent occurrence of noise from the exterior of the memory cell array MCA.

Even if the interval between the dummy bit lines DummyBL1 and Dummy/BL0 is not the same as the pitch between the paired bit lines in the memory cell array MCA, no particular problem occurs.

(Third Embodiment)

FIG. 9 is a schematic circuit diagram showing the configuration of the main portion of a series connected TC unit type ferroelectric RAM according to a third embodiment of this invention. The configuration of a memory cell block MCB is the same as that of the first embodiment.

A plurality of memory cell blocks MCB are arranged to configure memory cell arrays MCA1, MCA2. The memory cell blocks MCB in the memory cell arrays MCA1 and MCA2 are connected together by use of a common bit line. A sense amplifier circuit SA is connected between the respective common paired bit lines lying between the memory cell arrays MCA1 and MCA2. A column decoder CD is connected to each sense amplifier circuit SA.

A cell array selection transistor AST1 is inserted into that portion of the bit line BL0 which lies between the memory cell array MCA1 and the sense amplifier circuit SA. Further, a cell array selection transistor AST2 is inserted into that portion of the bit line BL0 which lies between the memory cell array MCA2 and the sense amplifier circuit SA. The gate of the cell array selection transistor AST1 is connected to a memory cell array selection line ASL1. The gate of the cell array selection transistor AST2 is connected to a memory cell array selection line ASL2. Likewise, cell array selection transistors AST1, AST2 are connected to the other bit lines. The memory cell arrays MCA1, MCA2 can be selected by use of memory cell array selection lines ASL1, ASL2 and each sense amplifier circuit SA and each column decoder CD can be commonly used.

A dummy bit line Dummy/BL is arranged outside the memory cell array MCA1 and separated from the bit line BL0 disposed on the end portion of the memory cell array MCA1 with an interval corresponding to the pitch between the paired bit lines in the memory cell array MCA1. The Dummy bit line Dummy/BL has the same width as the bit line in the memory cell array MCA1. A memory cell block MCB and a reference voltage generating circuit RVG1 are connected to the dummy bit line Dummy/BL. The reference voltage generating circuit RVG1 is configured by a dummy word transistor DWTn and reference capacitor RCn. One of the electrodes of the reference capacitor RCn is connected to a dummy plate line DPLn. The other electrode of the reference capacitor RCn is connected to the source/drain of the dummy word transistor DWTn. The drain/source of the dummy word transistor DWTn is connected to the dummy bit line Dummy/BL.

A dummy bit line DummyBL is arranged outside the memory cell array MCA2 and separated from the bit line BL0 disposed on the end portion of the memory cell array MCA2 with an interval corresponding to the pitch between the paired bit lines in the memory cell array MCA2. The Dummy bit line DummyBL has the same width as the bit line in the memory cell array MCA2. A memory cell block MCB and a reference voltage generating circuit RVG2 are connected to the dummy bit line DummyBL. The reference voltage generating circuit RVG2 is configured by a dummy word transistor DWTm+1 and reference capacitor RCm. One of the electrodes of the reference capacitor RCm is connected to a dummy plate line DPLm. The other electrode of the reference capacitor RCm is connected to the source/drain of the dummy word transistor DWTm+1. The drain/source of the dummy word transistor DWTm+1 is connected to the dummy bit line DummyBL.

The dummy bit lines DummyBL and Dummy/BL are connected to a sense amplifier circuit SA. The memory cell block MCB which is connected to the dummy bit line Dummy/BL is connected to the word lines which are arranged for the memory cell array MCA1. The memory cell block MCB which is connected to the dummy bit line DummyBL is connected to the word lines which are arranged for the memory cell array MCA2. Thus, architecture that the pair of dummy bit lines DummyBL and Dummy/BL is connected to different word lines, respectively, is referred to as open bit-line architecture.

In the series connected TC unit type ferroelectric RAM with the above configuration, the bit line BL0 on the memory cell array MCA1 side receives coupling noise of $2\delta$ from the adjacent bit line /BL0 and dummy bit line Dummy/BL.

Further, the bit line BL0 on the memory cell array MCA2 side receives coupling noise of $2\delta$ from the adjacent bit line /BL0 and dummy bit line DummyBL.

As described above, in the present embodiment, in the series connected TC unit type ferroelectric RAM in which the bit lines and sense amplifier circuits SA are commonly used, one of the two memory cell arrays MCA1, MCA2 is selected and data is sensed, one of the paired dummy bit lines DummyBL and Dummy/BL is arranged outside the memory cell array MCA1 with an interval which is the same as the pitch between the paired bit lines in the memory cell array MCA1. The other dummy bit line is arranged outside the memory cell array MCA2 with an interval which is the same as the pitch between the paired bit lines in the memory cell array MCA2. Further, the Dummy bit lines DummyBL and Dummy/BL respectively have the same width as the bit line.

Therefore, according to the present embodiment, an imbalance in the coupling noise occurring on the bit line disposed on the end portion of each memory cell array MCA can be eliminated. As a result, a reduction in the sense margin of the sense amplifier circuit SA can be prevented and data can be correctly sensed.

Further, since the paired bit lines are formed of an open form and arranged for each memory cell array MCA, an increase in the chip area can be suppressed in comparison with the case wherein the paired dummy bit lines are arranged for the respective memory cell arrays MCA.

Figure 10:
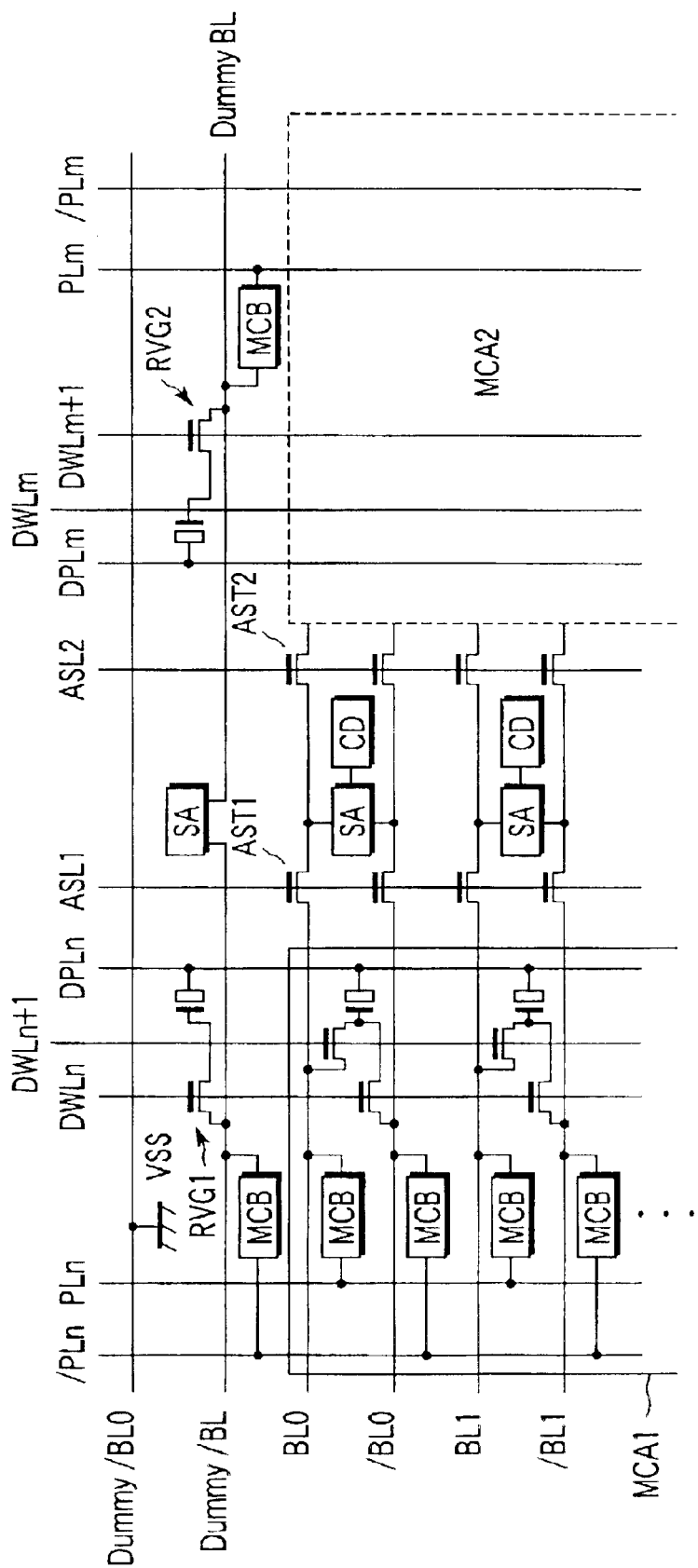
FIG. 10 is a schematic circuit diagram showing a modification of the series connected TC unit type ferroelectric RAM shown in FIG. 9.

Further, a dummy bit line DummyBL0 whose potential is fixed at VSS (ground potential) can be arranged outside the paired dummy bit lines DummyBL, Dummy/BL. FIG. 10 is a schematic circuit diagram showing the configuration of the main portion of the series connected TC unit type ferroelectric RAM with the above configuration.

The dummy bit line Dummy/BL0 is arranged outside the paired dummy bit lines DummyBL, Dummy/BL with the same pitch as that between the paired bit lines in the memory cell array MCA.

With the above configuration, noise from the exterior to the memory cell array MCA and paired dummy bit lines DummyBL, Dummy/BL can be prevented.

Even if the interval at which the dummy bit line Dummy/BL0 is arranged is not the same as the pitch between paired bit lines in the memory cell array MCA, no particular problem occurs.

(Fourth Embodiment)

In a fourth embodiment of this invention, a dummy bit line is arranged outside the memory cell array MCA and reference voltage is applied to the dummy bit line.

Figure 11:
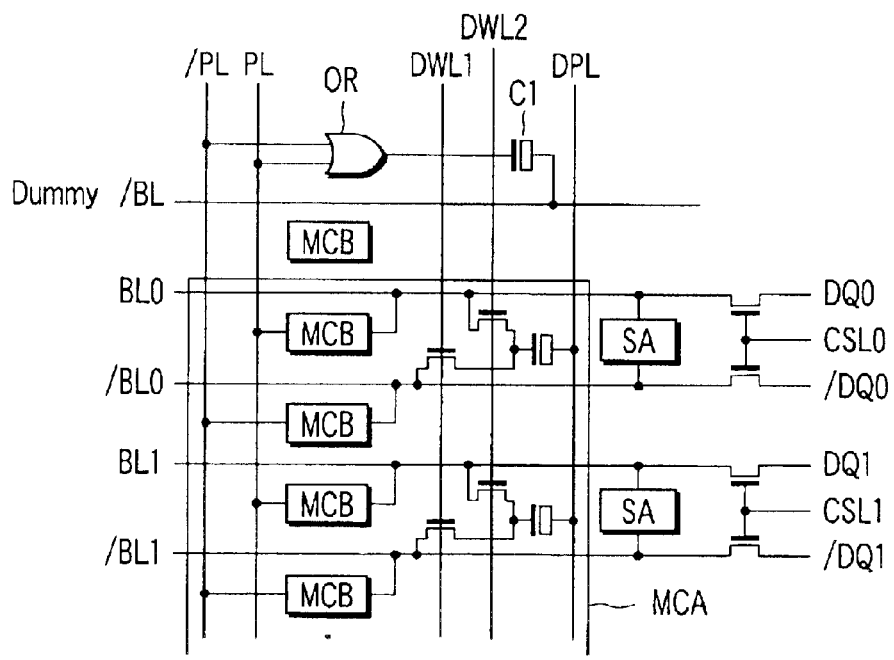
FIG. 11 is a schematic circuit diagram showing the configuration of the main portion of a series connected TC unit type ferroelectric RAM according to a fourth embodiment of this invention.

FIG. 11 is a schematic circuit diagram showing the configuration of the main portion of a series connected TC unit type ferroelectric RAM according to the fourth embodiment of this invention. The configuration of the memory cell array MCA is the same as that in the first embodiment.

A dummy bit line Dummy/BL is arranged outside the memory cell array MCA and separated from a bit line BL0 disposed on the end portion of the memory cell array MCA with an interval corresponding to the pitch between the paired bit lines in the memory cell array MCA. A memory cell block MCB is arranged with respect to the dummy bit line Dummy/BL, but it is not connected to the dummy bit line Dummy/BL and plate line PL.

One of the electrodes of a reference capacitor C1 is connected to the dummy bit line Dummy/BL. The other electrode of the reference capacitor C1 is connected to plate lines PL, /PL via an OR circuit. For example, the capacitance of the capacitor C1 is set so that an intermediate value of readout potentials of "1" data and "0" data will be applied to the dummy bit line Dummy/BL.

In the series connected TC unit type ferroelectric RAM with the above configuration, reference voltage is applied to the dummy bit line Dummy/BL at the active time. Therefore, coupling noise $\delta$ from the bit line /BL0 and coupling noise $\delta'$ from the dummy bit line Dummy/BL based on the reference voltage occur in the bit line BL0.

Thus, according to the present embodiment, an imbalance in the coupling noise occurring in the bit line arranged on the end portion of the memory cell array MCA can be suppressed.

Further, since only one dummy bit line is used, the chip area can be reduced in comparison with the case wherein the paired dummy bit lines are arranged.

In the present embodiment, the OR circuit is used as an example of a circuit which detects drive of the plate lines PL, /PL. But this is not limitative. Any circuit will do as long as it can detect drive of the plate lines PL, /PL.

(Fifth Embodiment)

In a fifth embodiment of this invention, a dummy memory cell block DMCB is arranged outside a memory cell array MCA.

Figure 12:
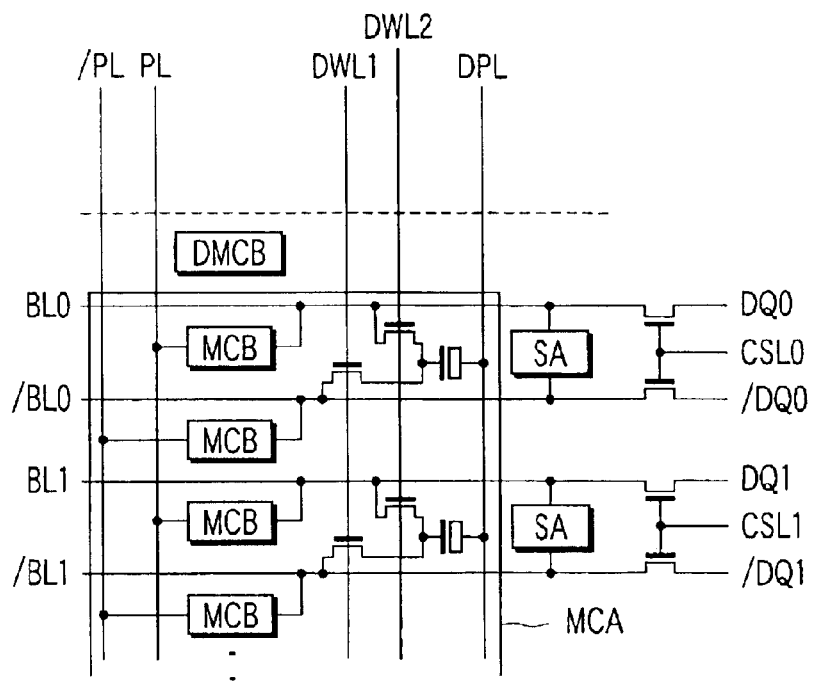
FIG. 12 is a schematic circuit diagram showing the configuration of the main portion of a series connected TC unit type ferroelectric RAM according to a fifth embodiment of this invention.

FIG. 12 is a schematic circuit diagram showing the configuration of the main portion of a series connected TC unit type ferroelectric RAM according to the fifth embodiment of this invention. The configuration of the memory cell array MCA is the same as that of the first embodiment.

The dummy memory cell block DMCB is arranged outside the memory cell array MCA. A dummy bit line which is generally arranged outside the memory cell array MCA and whose potential is fixed at VSS is eliminated.

In the series connected TC unit type ferroelectric RAM with the above configuration, the influence caused by the wiring capacitance from the dummy bit line which is fixed at VSS and given to the bit line BL0 is eliminated. As a result, the capacitance associated with the bit line BL0 is made smaller in comparison with capacitances associated with bit lines in the memory cell array MCA.

Thus, according to the present embodiment, coupling noise with respect to the bit line BL0 from the other bit lines in the memory cell array MCA becomes larger. Therefore, an imbalance in the coupling noise of the bit line BL0 can be suppressed.

(Sixth Embodiment)

Figure 13:
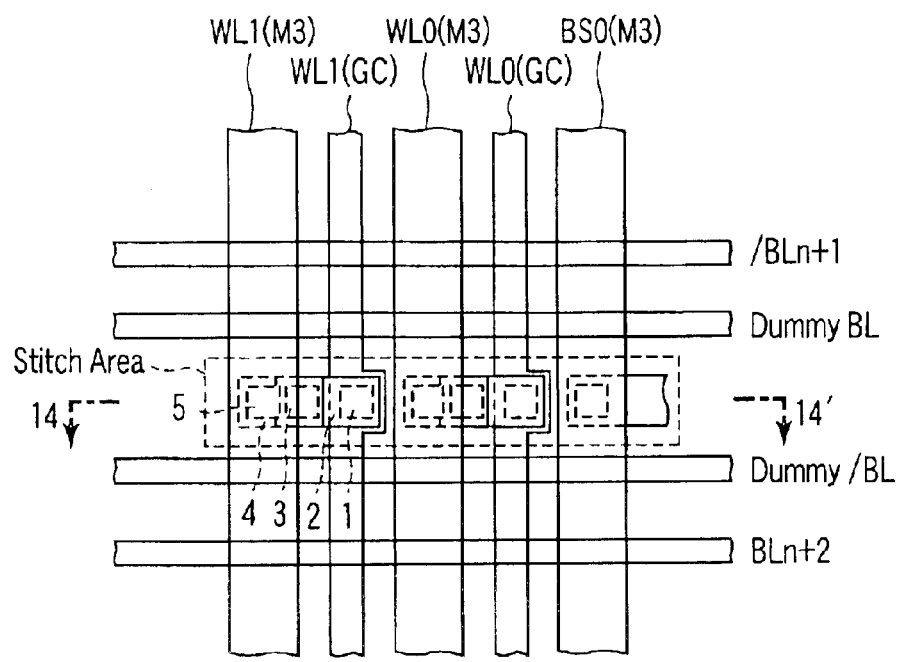
FIG. 13 is a plan view showing the main portion of a series connected TC unit type ferroelectric RAM according to a sixth embodiment of this invention.
Figure 14:
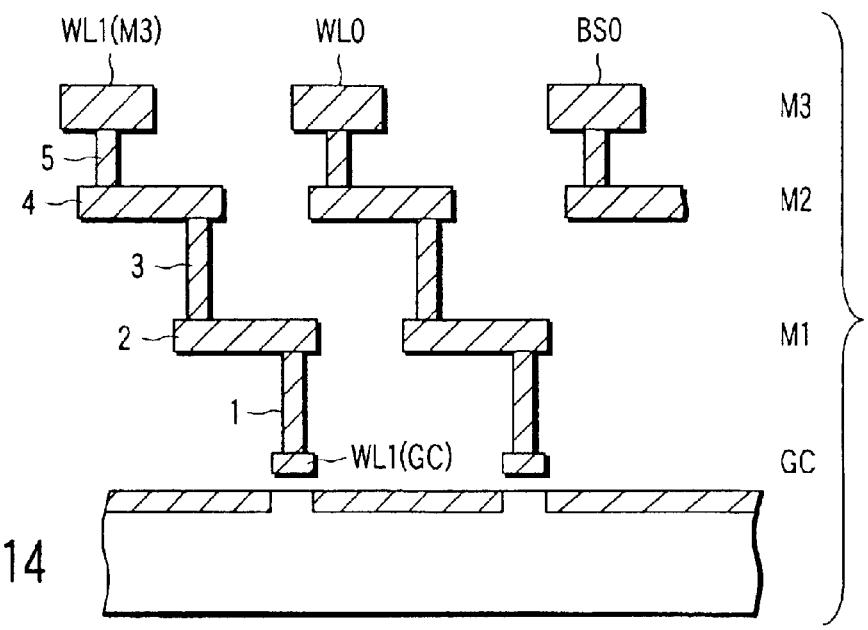
FIG. 14 is a cross sectional view taken along the 14–14' line of FIG. 13.

FIG. 13 is a plan view showing the main portion of a series connected TC unit type ferroelectric RAM according to a sixth embodiment of this invention. FIG. 14 is a cross sectional view taken along the 14–14' line of FIG. 13.

A stitch area is formed in an internal portion of a memory cell array MCA (which is a portion between bit lines /BLn+1 and BLn+2 in this embodiment). The stitch area is provided to suppress the delay of signals of word lines WL and block selection line BSL. Metal wirings (three-layered metal wirings M1, M2, M3 in this embodiment) are arranged parallel to the word lines WL and block selection line BSL. Further, the stitch area is provided to connect the gate wirings GC to the metal wirings every predetermined memory cell blocks MCB.

The configuration of the stitch area is explained by taking a word line WL1 as an example. A gate wiring WL1(GC) is connected to a first-layered metal wiring WL1(M1) 2 via a plug 1. The metal wiring WL1(M1) 2 is connected to a second-layered metal wiring WL1(M2) 4 via a plug 3. The metal wiring WL1(M2) 4 is connected to a third-layered metal wiring WL1(M3) via a plug 5.

Figure 15:
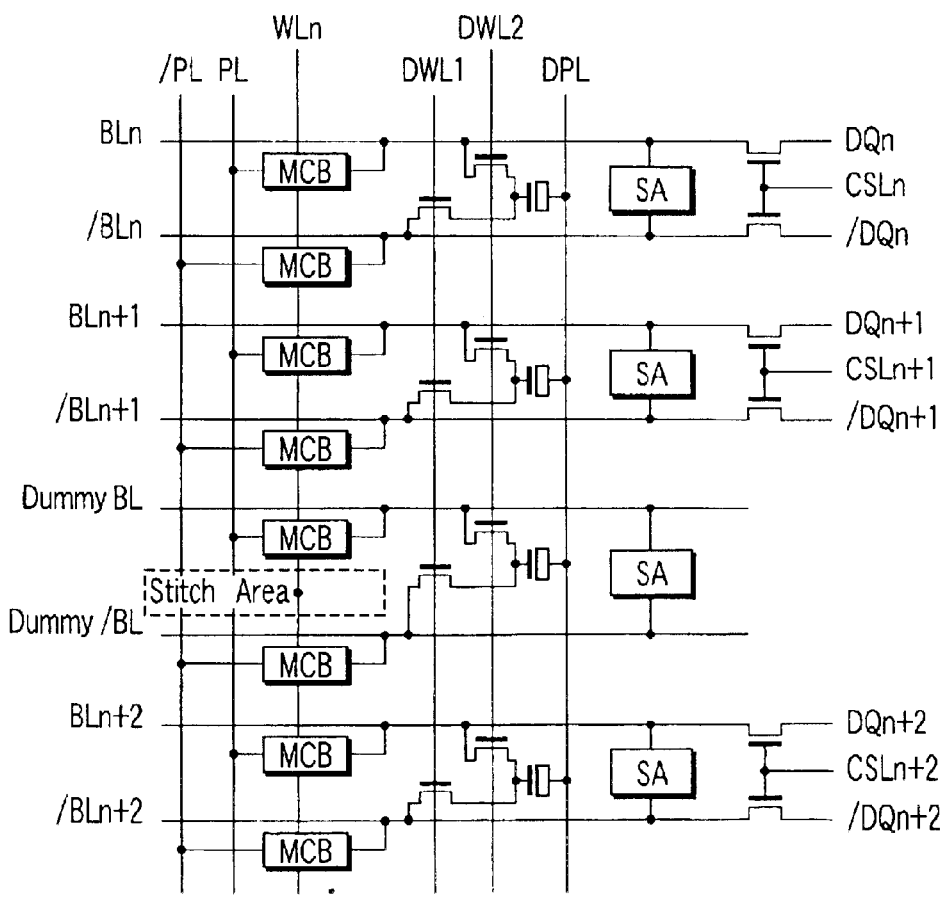
FIG. 15 is a schematic circuit diagram showing the configuration of the main portion of the series connected TC unit type ferroelectric RAM shown in FIG. 13.

FIG. 15 is a schematic circuit diagram showing the configuration of the main portion of the series connected TC unit type ferroelectric RAM shown in FIG. 13.

Dummy bit lines DummyBL, Dummy/BL are arranged on both sides of the stitch area. The dummy bit lines DummyBL, Dummy/BL are respectively separated from adjacent bit lines /BLn+1, BLn+2 with an interval corresponding to the pitch between paired bit lines in the memory cell array MCA. The Dummy bit lines DummyBL and Dummy/BL respectively have the same width as the bit line in the memory cell array MCA. Memory cell blocks MCB are respectively connected to the dummy bit lines DummyBL, Dummy/BL and a reference voltage generating circuit RVG and sense amplifier circuit SA are connected therebetween. In this case, data lines and a column gate are not connected to the dummy bit lines DummyBL, Dummy/BL.

In the series connected TC unit type ferroelectric RAM with the above configuration, the pitch between the bit lines /BLn+1 and BLn+1 is equal to the pitch between the bit line /BLn+1 and the dummy bit line DummyBL. Therefore, the bit line /BLn+1 receives the same coupling noise δ from the bit lines lying on both sides thereof. This applies to the bit line BLn+2.

As described above, in the present embodiment, in order to eliminate an imbalance in the coupling noise between the bit lines caused by forming the stitch area in the memory cell array MCA, the dummy bit lines DummyBL, Dummy/BL are arranged on both sides of the stitch area. Further, the Dummy bit lines DummyBL and Dummy/BL respectively have the same width as the bit line in the memory cell array MCA.

Therefore, according to the present embodiment, the pitches between each of the bit lines /BLn+1, BLn+2 and the bit lines arranged on both sides of each of the bit lines /BLn+1, BLn+2 can be made equal to each other and an imbalance in the coupling noise occurring on the bit lines /BLn+1, BLn+2 can be suppressed. As a result, a reduction in the sense margin of the sense amplifier circuit SA can be prevented and data can be correctly sensed.

Further, since the sense amplifier circuit SA is connected to the dummy bit lines DummyBL, Dummy/BL, the same operation as that of the bit lines in the memory cell array MCA can be attained. Therefore, the same coupling noise as that of the other bit lines can be caused with respect to the bit line BL0.

Further, since the data lines DQ are not connected to the dummy bit lines DummyBL, Dummy/BL, an extra circuit can be omitted and the space of the circuit can be reduced.

(Seventh Embodiment)

In a seventh embodiment of this invention, dummy bit line pairs are arranged on both sides of a stitch area formed in a memory cell array MCA. Therefore, an imbalance in the coupling noise occurring on a bit line according to provide the stitch area is suppressed.

Figure 16:
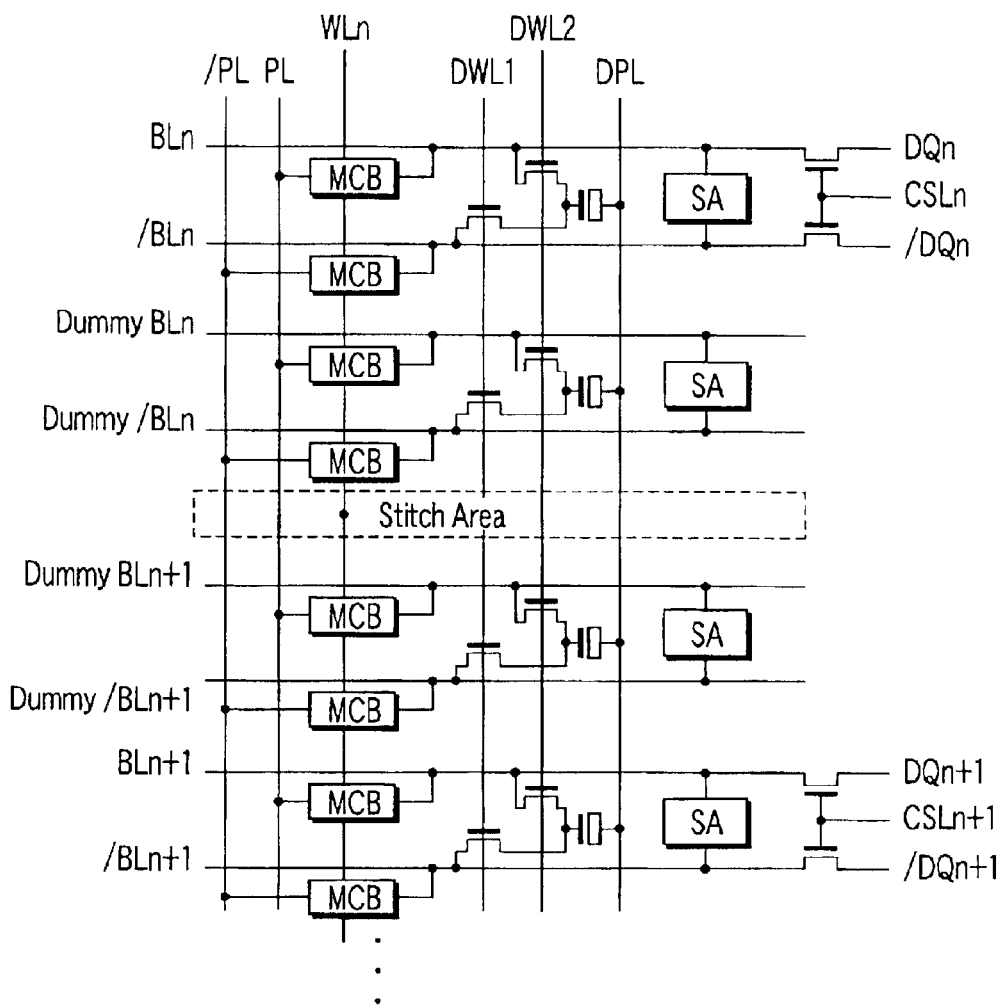
FIG. 16 is a schematic circuit diagram showing the configuration of the main portion of a series connected TC unit type ferroelectric RAM according to a seventh embodiment of this invention.

FIG. 16 is a schematic circuit diagram showing the configuration of the main portion of a series connected TC unit type ferroelectric RAM according to the seventh embodiment of this invention. The configuration of the stitch area is the same as that of the sixth embodiment.

The dummy bit line pairs are arranged on both sides of the stitch area. The paired dummy bit lines DummyBLn, Dummy/BLn are arranged between the stitch area and a bit line /BLn and intervals between the bit line /BLn and the dummy bit line DummyBLn and between the dummy bit lines DummyBLn and Dummy/BLn are set equal to an interval which is the same as the pitch between the paired bit lines in the memory cell array MCA. The Dummy bit lines DummyBLn and Dummy/BLn respectively have the same width as the bit line in the memory cell array MCA. Memory cell blocks MCB are respectively connected to the dummy bit lines DummyBLn, Dummy/BLn and a reference voltage generating circuit RVG and sense amplifier circuit SA are connected therebetween. In this case, data lines and a column gate are not connected to the dummy bit lines DummyBL, Dummy/BL.

The dummy bit lines DummyBLn+1, Dummy/BLn+1 are arranged between the stitch area and the bit line BLn+1. The other configuration is the same as that of the dummy bit lines DummyBLn, Dummy/BLn.

In the series connected TC unit type ferroelectric RAM with the above configuration, the interval between the bit line /BLn and the dummy bit line DummyBLn and the interval between the dummy bit lines DummyBLn and Dummy/BLn are equal to the pitch between the paired bit lines in the memory cell array MCA. Therefore, since the wiring parasitic capacitance between the bit line /BLn and the dummy bit line DummyBLn becomes equal to the wiring parasitic capacitance between the paired dummy bit lines DummyBLn and Dummy/BLn. AS a result, coupling noise with respect to the bit line /BLn from the dummy bit line Dummy/BLn other bit lines is the same as coupling noise between the paired dummy bit lines in the memory cell array MCA.

Thus, according to the present embodiment, in addition to the effect obtained in the seventh embodiment, an imbalance in the coupling noise caused by the wiring parasitic capacitance between the paired dummy bit lines DummyBLn and Dummy/BLn can be suppressed with respect to the bit line /BLn. This applies to the bit line BLn+1.

The series connected parallel-TC unit type ferroelectric memories of the above embodiments are explained to have the common configuration for the 2T2C system and 1T1C system, but it can be formed with a configuration which can be applied only to one of the 2T2C system and 1T1C system.

Figure 17:
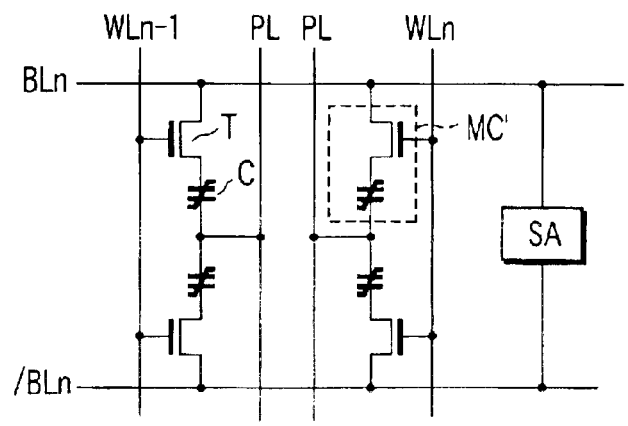
FIG. 17 is a diagram showing the main portion of another example of a ferroelectric memory device.

Further, in the above embodiments, a case wherein the series connected TC unit type ferroelectric RAM is used as an example of the ferroelectric memory device is explained, but this is not limitative. FIG. 17 is a diagram showing the main portion of another example of the ferroelectric memory device.

The gate of a transistor T is connected to a word line WL. The source or drain region of the transistor T is connected to a bit line BL. The drain or source region of the transistor T is connected to one of the electrodes of a ferroelectric capacitor C. The other electrode of the ferroelectric capacitor C is connected to a plate line to form a memory cell MC'. That is, the transistor T and ferroelectric capacitor C are connected in series. A plurality of memory cells having the same configuration as that of the above memory cell are arranged to configure a memory cell array. When applying a ferroelectric memory device with the above configuration to the above embodiments, the same effect can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
a memory cell array having a plurality of memory cells arranged in a matrix form, each of the memory cells including a cell transistor and a ferroelectric capacitor, one of source and drain regions of the cell transistor being electerically connected to a corresponding one of a plurality of bit lines, a gate of the cell transistor being electrically connected to a corresponding one of a plurality of word lines, the other one of the source and drain regions of the cell transistor being electrically connected to one electrode of the ferroelectric capacitor, the other electrode of the ferroelectric capacitor being electrically connected to a corresponding one of a plurality of plate lines;
a first dummy bit line arranged outside a bit line arranged on an end portion of the memory cell array, and separated from the bit line arranged on the end portion of the memory cell array with an interval which is the same as a pitch between the bit lines in the memory cell array, the first dummy bit line having the same width as the bit line, and not electrically connected to a data line which transmits data; and
a first dummy memory cell electrically connected to the first dummy bit line and including a cell transistor and a ferroelectric capacitor.

2. The ferroelectric memory device according to claim 1, further comprising a second dummy bit line arranged outside the first dummy bit line and fixed at a predetermined potential.

3. The ferroelectric memory device according to claim 1, further comprising a second dummy bit line arranged outside the first dummy bit line, and separated from the first dummy bit line with the interval, the second dummy bit line having the same width as the bit line, and not electrically connected to a data line which transmits data, and a second dummy memory cell to which data complementary to data of the first dummy memory cell is transferred, the second dummy memory cell being electrically connected to the second dummy bit line and including a cell transistor and a ferroelectric capacitor.

4. The ferroelectric memory device according to claim 3, further comprising a sense amplifier circuit which is electrically connected to the first and second dummy bit lines and senses a signal based on potentials of the first and second dummy bit lines.

5. The ferroelectric memory device according to claim 4, further comprising a third dummy bit line arranged outside the second dummy bit line and fixed at predetermined potential.

6. A ferroelectric memory device comprising:
a first memory cell array having a plurality of memory cells arranged in a matrix form, each of the memory cells including a cell transistor and a ferroelectric capacitor, one of source and drain regions of the cell transistor being electrically connected to a corresponding one of a plurality of first bit lines, a gate of the cell transistor being electrically connected to a corresponding one of a plurality of first word lines, the other one of the source and drain regions of the cell transistor being electrically connected to one electrode of the ferroelectric capacitor, the other electrode of the ferroelectric capacitor being electrically connected to a corresponding one of a plurality of first plate lines;
a second memory cell array arranged adjacent to the first memory cell array and having a plurality of memory cells arranged in a matrix form, each of the memory cells including a cell transistor and a ferroelectric capacitor, one of source and drain regions of the cell transistor being electrically connected to a corresponding one of a plurality of second bit lines, a gate of the cell transistor being electrically connected to as corresponding one of a plurality of second word lines, the other one of the source and drain regions of the cell transistor being electrically connected to one electrode of the ferroelectric capacitor, the other electrode of the ferroelectric capacitor being electrically connected to a corresponding one of a plurality of second plate lines;
a first dummy bit line arranged outside a first bit line arranged on an end portion of the first memory cell array;
a first dummy memory cell electrically connected to the first dummy bit line and including a cell transistor and a ferroelectric capacitor;
a second dummy bit line arranged outside a second bit line arranged on an end portion of the second memory cell array; and
a second dummy memory cell electrically connected to the second dummy bit line and including a cell transistor and a ferroelectric capacitor.

7. The ferroelectric memory device according to claim 6, further comprising a sense amplifier circuit which is electrically connected to the first and second dummy bit lines and senses a signal based on potentials of the first and second dummy bit lines.

8. The ferroelectric memory device according to claim 7, wherein a pair of dummy bit lines which includes the first and second dummy bit lines has open bit-line architecture in which the first dummy memory cell is connected to the first word line and the second dummy memory cell is connected to the second word line.

9. The ferroelectric memory device according to claim 7, further comprising a third dummy bit line arranged outside the first and second dummy bit lines and fixed at a predetermined potential.

10. A ferroelectric memory device comprising:

a memory cell array having a plurality of memory cells arranged in a matrix form, each of the memory cells including a cell transistor and a ferroelectric capacitor, one of source and drain regions of the cell transistor being electrically connected to a corresponding one of a plurality of bit lines, a gate of the cell transistor being electrically connected to a corresponding one of a plurality of word lines, the other one of the source and drain regions of the cell transistor being electrically connected to one electrode of the ferroelectric capacitor, the other electrode of the ferroelectric capacitor being electrically connected to a corresponding one of a plurality of plate lines; and a dummy memory cell which includes a cell transistor and a ferroelectric capacitor and is not electrically connected to the plurality of bit lines.

11. The ferroelectric memory device according to claim 1, wherein the first dummy bit line compensates for imbalance of noise caused by parasitic capacitance, with respect to the bit line arranged on the end portion of the memory cell array.

12. The ferroelectric memory device according to claim 6, wherein the first dummy bit line is separated from the first bit line arranged on the end portion of the first memory cell array with a first interval which is the same as a pitch between the first bit lines, and the second dummy bit line is separated from the second bit line arranged on the end portion of the second memory cell array with a second interval which is the same as a pitch between the second bit lines.

13. The ferroelectric memory device according to claim 6, wherein the first dummy bit line has the same width as the first bit line, and second dummy bit line has the same width as the second bit line.

14. The ferroelectric memory device according to claim 6, further comprising a plurality of sense amplifier circuits shared by the first memory cell array and the second memory cell array.

15. The ferroelectric memory device according to claim 14, wherein the plurality of first bit lines are formed of a plurality of pairs of first bit lines, the plurality of second bit lines are formed of a plurality of pairs of second bit lines, and each of the sense amplifier circuits detects a signal from a corresponding one of the pairs of first bit lines, and detects a signal from a corresponding one of the pairs of second bit lines.

16. The ferroelectric memory device according to claim 7, wherein data complementary to data of the first dummy memory cell is transferred to the second dummy memory cell.

17. The ferroelectric memory device according to claim 6, wherein the first and second dummy bit lines are not connected to data lines which transmit data, respectively.

18. The ferroelectric memory device according to claim 6, wherein the first dummy bit line compensates for imbalance of noise caused by parasitic capacitance, with respect to the first bit line arranged on the end portion of the first memory cell array, and the second dummy bit line compensates for imbalance of noise caused by parasitic capacitance, with respect to the second bit line arranged on the end portion of the second memory cell array.

* * * * *